US006075351A

United States Patent [19]

Benes

[11] Patent Number: 6,075,351

[45] Date of Patent: Jun. 13, 2000

[54] CONTROL SYSTEM WITH NONLINEAR NETWORK FOR LOAD TRANSIENTS

[75] Inventor: Michael J. Benes, Irvington, N.J.

[73] Assignee: Hewlett-Packard Company, Palo Alto, Calif.

[21] Appl. No.: 09/128,703

[22] Filed: Aug. 4, 1998

[51] Int. Cl.[7] .............................. G05F 1/44; H03G 3/00

[52] U.S. Cl. .............................. 323/280; 330/86; 323/281

[58] Field of Search .............................. 323/265, 273, 323/274, 275, 280, 281; 330/86, 282

[56] References Cited

U.S. PATENT DOCUMENTS

| | | | |
|---|---|---|---|
| 4,703,249 | 10/1987 | De La Plaza et al. | 323/280 X |
| 5,381,082 | 1/1995 | Schlicht | 323/280 |
| 5,686,820 | 11/1997 | Riggio, Jr. | 323/273 |

*Primary Examiner*—Y. J. Han

[57] ABSTRACT

A voltage control system that provides an output voltage of constant value to a load. The control system includes voltage supply means for providing the output voltage to the load. A feedback circuit supplies a feedback current. A summing circuit algebraically sums the feedback current and a reference current to provide an error signal that changes as the feedback current changes. These changes affect the amplitude of the output voltage delivered to the load. The error signal is processed by a voltage adjustment means including an error amplifier that amplifies the error signal for use in making an adjustment to the output voltage so as to maintain its constant value. A gain increasing means responds to transient changes in output voltage to momentarily increase the error amplifier gain to shorten system recovery time to constant output voltage.

10 Claims, 2 Drawing Sheets

CONTROL SYSTEM WITH NONLINEAR NETWORK FOR LOAD TRANSIENTS

FIELD OF INVENTION

This invention relates to a control system for controlling a load with an output voltage or an output current of constant value and, in particular, to such a system that has improved performance in response to transient currents.

BACKGROUND OF INVENTION

Control systems that control a load with an output voltage or an output current of constant value are known. One application of such systems is a constant voltage supply system. The control system generally includes means for providing the output voltage to the load. A feedback circuit supplies a feedback signal. A summing circuit algebraically sums the feedback current with a reference current to provide an error signal that changes as the feedback signal changes. The feedback signal serves to correct and regulate the magnitude of the output voltage delivered to the load. The error signal is processed by a voltage adjustment means including an error amplifier that amplifies the error signal for use in making an adjustment to the output voltage so as to maintain its constant value.

Control systems of this type are often subjected to relatively rapid step changes of current (transients) occurring as a result of operation of the load. This change in output load current results in an output voltage change that is fed back to the error amplifier via the summing circuit. The conventional error amplifier has a frequency compensation capacitor and series resistor in its feedback circuit that limits bandwidth and gain, with the result that control system response to such transients may be relatively slow. This can be detrimental in many applications. For example, too much drop in output voltage in cellular phone testing can result in phone shut down and an inability to test the phone properly.

One technique of addressing these load transients is to increase the gain of the error amplifier by reducing the value of a frequency compensation capacitor contained in the amplifier feedback circuit. In practice, however, this technique is of limited application since values of the capacitor which are too low will reduce stability and will result in an unstable or oscillatory control system.

Accordingly, there is a need for a control system with improved performance for handling load transients with rapid recovery times without affecting steady state operation and stability of the control system.

SUMMARY OF INVENTION

A control system according to the invention includes a feedback means coupled in circuit with a load to provide a feedback signal. A summing circuit sums the feedback signal and a reference signal to provide an error signal. A voltage adjustment means responds to the error signal to provide changes in output current and output voltage in a short time so that the output voltage is nearly restored to its constant value during this time.

The voltage adjustment means includes an amplifier and a means responsive to load transients to momentarily increase the amplifier gain so that system recovery time to restore the output voltage to constant value is relatively short.

The gain changing means contains an impedance altering means that is operable, only in response to a load transient, to momentarily change the value of an impedance in a feedback circuit of the amplifier so that the amplifier gain is increased. The impedance preferably includes a frequency compensation capacitor and a series resistor. The impedance altering means acts to momentarily reduce the effective value of the capacitor and simultaneously increase the effective value of the series resistor..

The impedance altering means is preferably a diode, that during steady state operation, is non-conducting. When a load transient occurs, the diode becomes forward biased to decrease the effective value of the capacitor and increase the effective value of the series resistor. This action provides a correction voltage that is processed to provide control system output changes that result in a rapid recovery time during which the output voltage returns substantially to its constant value.

BRIEF DESCRIPTION OF DRAWINGS

Other advantages and features of the present invention will be understood by reference to the following specification in conjunction with the accompanying drawings, in which like reference characters denote like elements of structure and.

DESCRIPTION OF PREFERRED EMBODIMENT

Figure 1:
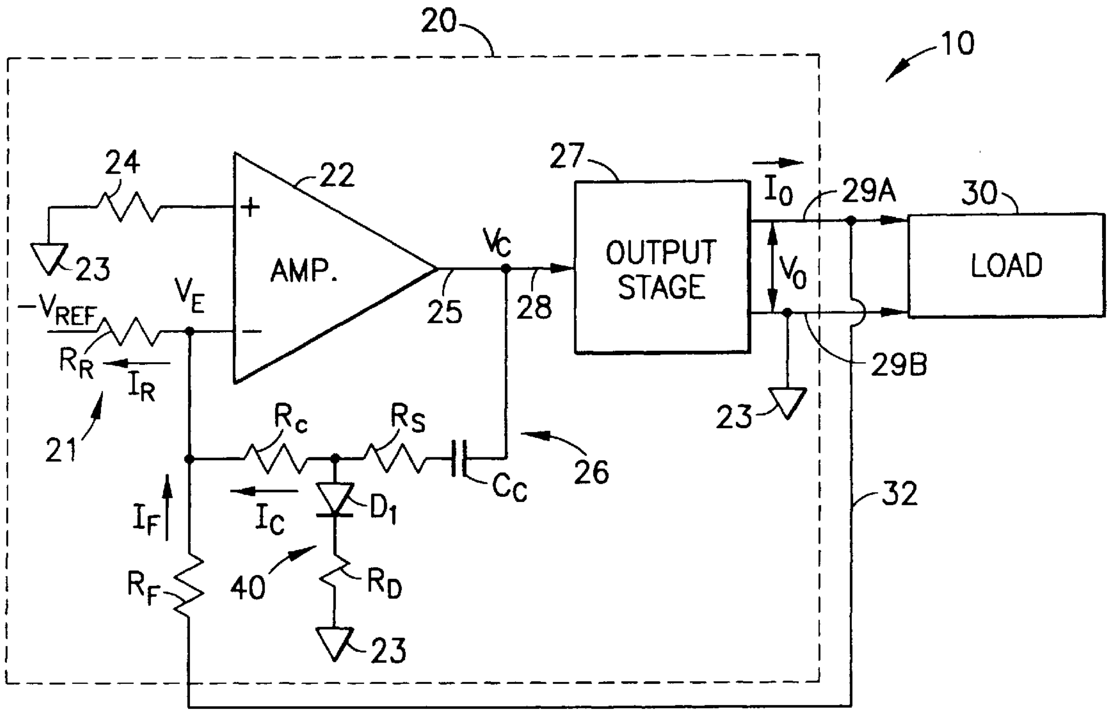
FIG. 1 is a block diagram in part and a circuit diagram in part of a control system in accord with the present invention.

With reference to FIG. 1, a control system 10 has a voltage supply 20 that provides an output voltage $V_O$ to a load 30. A feedback circuit 32 couples the output voltage $V_O$, via a feedback impedance $R_F$, as a feedback current $I_F$. Voltage supply 20 includes a summing circuit 21 for algebraically summing feedback current $I_F$, a reference current $I_R$ and a current $I_C$ to provide an error signal $V_E$. The reference current $I_R$ is provided via a reference resistor $R_R$ from a reference voltage, designated as $-V_{REF}$. The current $I_C$ flows in a resistor $R_C$.

Voltage supply 20 also includes an error amplifier 22 that has a plus input and a minus input. The plus input is connected to circuit common 23 via a resistor 24. The minus input is connected to summing circuit 21 to receive the error signal $V_E$. Amplifier 22 has an output 25 that is connected with the minus input to amplifier 22 via an amplifier feedback circuit 26. Amplifier feedback circuit 26 includes a frequency compensation impedance comprised of a compensation capacitor CC and of resistors $R_S$ and $R_C$.

Voltage supply 20 further includes a non-inverting output stage 27 that has an input 28 and outputs 29A and 29B. Input 28 is connected to output 25 of amplifier 22. For the illustrated embodiment, outputs 29A and 29B are considered as positive and negative, respectively. To this end, output 29B is connected to circuit common 23. Outputs 29A and 29B are connected to provide output current $I_O$ and output voltage $V_O$ to load 30.

According to the present invention, a gain changing means is provided to momentarily change the error amplifier gain in response to transients. The gain changing means takes the form of an impedance altering means 40 that is provided in amplifier feedback circuit 26 for momentarily altering the impedance of feedback circuit during the occurrence of load transients. Impedance altering means 40 includes a series diode D1 and a resistor $R_D$ connected in series between the juncture of resistors $R_S$ and $R_C$ and circuit common 23.

In steady state operation, output stage 27 is operable to provide constant output voltage $V_O$ and output current $I_O$ to load 30. To this end, output stage 27 includes a voltage source and a non-inverting active device (for example, a bipolar transistor), neither of which is shown in the drawing. Any variation from the constant value of output voltage $V_O$ is detected by summing circuit 21 to produce a variation in error signal $V_E$. Amplifier 22 amplifies error signal $V_E$ to provide a correction voltage $V_C$ at its output 25. Correction voltage $V_C$ drives output stage 27 to provide adjustments in output voltage $V_O$ and output current $I_O$ to restore voltage $V_O$ to its constant value.

In steady state operation, the summing circuit 21 acts to keep the minus input of amplifier 22 at approximately circuit common, with the dc value of $I_C$ being zero due to the blocking action of $C_C$. Thus, the dc voltage on RC is zero, diode D1 is non-conducting and impedance altering means 40 is not operative.

Load transients that cause the output voltage $V_O$ to dip substantially will cause an increase in $I_C$ and thus cause diode D1 to become forward biased and conductive so as to reduce the effective value of capacitor $C_C$. This will happen when output voltage $V_O$ dips by more than about $V_D x R_F/R_C$, where $V_D$ is the voltage drop across diode D1. When diode D1 conducts, resistor $R_D$ is connected into the amplifier feedback circuit 26. This causes some of the output current of amplifier 22 to be diverted from capacitor $C_C$ to circuit common 23 via resistor $R_D$. This results in amplifier 22 reacting more quickly with higher gain to large transient changes in error signal $V_E$ to produce a relatively large amplitude correction voltage $V_C$. Output stage 27 responds to provide a lower transient amplitude output voltage $V_O$ and a fast rise time change in output current $I_O$.

Figure 2:
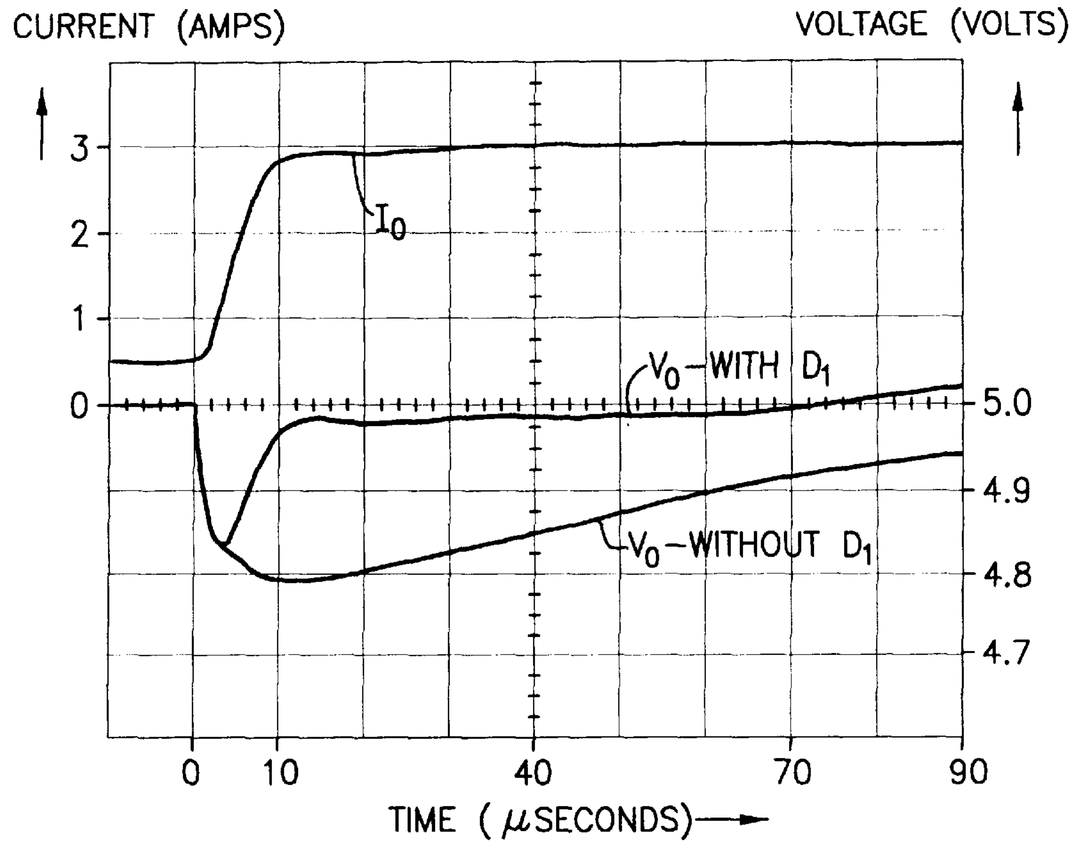
FIG. 2 is a graph showing a transient change in feedback current and control system response thereto.

With reference to FIG. 2, the change in output current $I_O$ and the transient response of the output voltage $V_O$ are shown in a graph having time as its abscissa. Current values in amperes are shown on the left hand ordinate and voltage values in volts are shown on the right hand ordinate. For this example, the steady state voltage is 5 volts.

For a transient that occurs at time equal to zero, control system output voltage $V_O$ with diode D1 dips negative from its constant value by about 165 millivolts. By time equal to about 10 seconds, $V_O$ has recovered substantially at about 26 millivolts below constant value. This is to be compared with the curve for $V_O$ without diode D1 that has a higher amplitude dip of about 209 millivolts from the constant value and a recovery time that exceeds 90 $\mu$seconds to return substantially to constant value. The output current $I_O$ rises rapidly from about 0.5 ampere at time equal to zero to about 2.75 amperes at 10 $\mu$seconds.

In the FIG. 1 embodiment, Outputs 29A and 29B are shown as positive and negative, respectively. It is understood that the polarity can be reversed, in which case the polarity of diode Dl will be reversed and $V_{REF}$ will be $+V_{REF}$. Also, the voltage dips in FIG. 2 will be positive going and the current change will be negative going.

Figure 3:
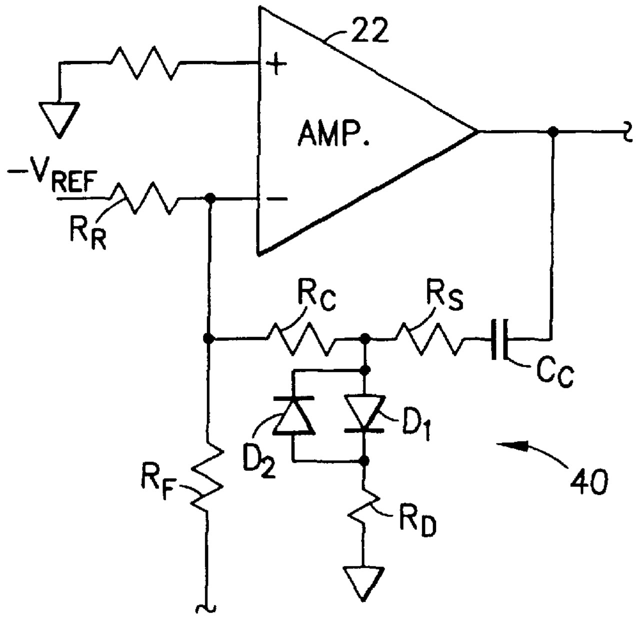
FIG. 3 is an alternative embodiment of the FIG. 1 control system that is capable of handling both positive and negative going transients.

Referring now to FIG. 3, there is shown another embodiment that is capable of improved response to both negative going and positive going transients. To this end, a second diode D2 is connected in parallel with diode D1, but with opposite polarity. That is the diodes are connected anode of one to cathode of the other. As in FIG. 1, summing circuit 21 acts during steady state conditions to keep the minus input of amplifier 22 at approximately circuit common with the dc value of $I_C$ being zero and with small signal variations in $V_E$ insufficient to forward bias either diode D1 or diode D2. Accordingly, both diodes D1 and D2 are non-conducting and impedance altering means 40 is not operative. For positive going changes in output current $I_O$ (loading transients), diode D1 conducts. For negative going changes in output current $I_O$ (unloading transients), diode D2 conducts.

As mentioned above, impedance altering means responds to a transient to connect resistor $R_D$ into amplifier feedback circuit 26. This acts to momentarily change the effective values of capacitor $C_C$ and resistor $R_S$, thereby momentarily increasing the feedback loop bandwidth while the diode is conducting. When diode D1 is conducting, the effective values of $C_C$, $R_S$ and $R_C$ are given by:

Effective value of $C_C$=Actual CC value/1+$R_C/R_D$;

Effective Value of $R_S$=(Actual RS)(1+$R_C/R_D$); and

Effective value of $R_C$=Actual $R_C$.

Although the preferred embodiment of the present invention described above is for a constant voltage control system, the invention applies to any control system for regulating or maintaining an electrical output energy such as voltage, current or power.

The present invention having been thus described with particular reference to the preferred forms thereof, it will be obvious that various changes and modifications may be made therein without departing from the spirit and scope of the present invention as defined in the appended claims.

What is claimed is:

1. A control system for controlling a load with an electrical output energy of a constant value, said control system comprising:

feedback means coupled in circuit with said load to provide a feedback current, changes in said feedback current being indicative of changes in said output energy from said constant value;

a summing circuit for summing said feedback current with a reference current to provide an error signal;

adjustment means responsive to said changes in said error signal to make an adjustment in said output energy to return said output energy to said constant value, said adjustment means including:

an error amplifier having an input, an output and a feedback control circuit, said error amplifier input being connected to receive said error signal; and gain changing means responsive to transient changes in feedback current to momentarily change an impedance of said feedback control circuit and, as a result, change in gain of said error amplifier so as to reduce a period of time required to achieve said adjustment.

2. The control system according to claim 1 wherein said gain changing means is operable only during said recovery time.

3. The control system according to claim 2, wherein said feedback control circuit is connected between said amplifier input and output, and includes an impedance altering means that is operable in response to said transient changes in said feedback current to momentarily change the effective value of said impedance.

4. The control system according to claim 3, wherein said impedance altering means includes diode means that becomes forward biased only in response to said transient changes in feedback current.

5. The control system according to claim 4, wherein said impedance altering means further includes a resistor that is connected in circuit with said impedance when said diode means becomes forward biased.

6. The control system according to claim 5, wherein said diode means includes first and second diodes connected anode to cathode in parallel, whereby the first and second diodes become forward biased by said transient changes that are positive and negative going, respectively.

7. A control system for controlling a load with an output voltage of a constant value, said control system comprising:

feedback means coupled in circuit with said load to provide a feedback current, changes in said feedback current being indicative of changes in said output voltage from said constant value;

a summing circuit for summing said feedback current with a reference current to provide an error signal;

voltage adjustment means responsive to changes in said error signal to make an adjustment in said output voltage to return said output voltage to said constant value, said voltage adjustment means including:

an error amplifier having an input and an output, said error amplifier input being connected to receive said error signal;

an error amplifier feedback circuit having a capacitor and a series resistor connected with said error amplifier input and output;

gain control means responsive to transient changes in feedback current to momentarily increase a gain of said error amplifier by momentarily changing an effective impedance value of said capacitor and said series resistor, said gain control means including diode means that becomes forward biased only in response to said transient changes in feedback current to cause said changes in said effective impedance value.

8. The control system according to claim 7 wherein said gain control means further includes a resistor that is connected in circuit with said capacitor when said diode means becomes forward biased.

9. The control system according to claim 8, wherein said diode means includes first and second diodes connected anode to cathode in parallel, whereby the first and second diodes become forward biased by said transient changes that are positive and negative going, respectively.

10. A control system for controlling a load with an output voltage of a constant value, said control system comprising:

a sense lead coupled in circuit with said load to provide a feedback current, changes in said feedback current being indicative of changes in said output voltage from said constant value;

a summing circuit coupled to said sense lead for combining said feedback current with a reference current to provide an error signal;

an error amplifier having an input and an output, said error amplifier input being connected to receive said error signal;

an error amplifier feedback circuit having a capacitor and a series resistor connected between said error amplifier output and said summing circuit;

a diode coupled between said capacitor and said resistor and a source of reference potential and responsive to transient changes in feedback current to be rendered conductive so as to momentarily increase a gain of said error amplifier by momentarily changing an effective impedance value of said capacitor and said series resistor and thereby altering current flow to said summing circuit; and whereby said error amplifier rapidly responds to changes in said error signal to make an adjustment in said output voltage to return said output voltage to said constant value.

* * * * *